United States Patent
Cadena

(10) Patent No.: US 11,770,779 B2
(45) Date of Patent: Sep. 26, 2023

(54) WIDE-BAND AUTOMATED GAIN CONTROL FOR BURSTY FRAMES

(71) Applicant: Jorge Cadena, Silver Spring, MD (US)

(72) Inventor: Jorge Cadena, Silver Spring, MD (US)

(73) Assignee: Hughes Network Systems, Germantown, MD (US)

( * ) Notice: Subject to any disclaimer, the term of this patent is extended or adjusted under 35 U.S.C. 154(b) by 126 days.

(21) Appl. No.: 17/546,802

(22) Filed: Dec. 9, 2021

(65) Prior Publication Data

US 2022/0377682 A1 Nov. 24, 2022

Related U.S. Application Data

(60) Provisional application No. 63/191,393, filed on May 21, 2021.

(51) Int. Cl.
*H04W 52/52* (2009.01)
*H03G 3/30* (2006.01)

(52) U.S. Cl.
CPC .......... *H04W 52/52* (2013.01); *H03G 3/3036* (2013.01)

(58) Field of Classification Search
CPC ........ H03G 3/3036; H04B 1/16; H04W 52/52
See application file for complete search history.

(56) References Cited

U.S. PATENT DOCUMENTS

| | | | | |
|---|---|---|---|---|
| 5,175,883 A | * | 12/1992 | Ueno | H04B 1/16 |
| | | | | 455/248.1 |
| 2006/0217094 A1 | * | 9/2006 | Ikeda | H03G 3/3052 |
| | | | | 455/136 |
| 2008/0181283 A1 | | 7/2008 | Elhanati et al. | |
| 2015/0180516 A1 | | 6/2015 | Salvi et al. | |
| 2016/0381647 A1 | * | 12/2016 | Shahar | H04B 1/1036 |
| | | | | 370/252 |

FOREIGN PATENT DOCUMENTS

| | | |
|---|---|---|
| EP | 1772968 A3 | 5/2008 |
| JP | S5992627 | 5/1984 |

OTHER PUBLICATIONS

International search report for PCT Application No. PCT/US2022/072334, dated Jul. 2022.

* cited by examiner

*Primary Examiner* — Nguyen T Vo
(74) *Attorney, Agent, or Firm* — Capitol City TechLaw; Jasbir Singh

(57) ABSTRACT

A method and system to provide adaptive power control for a Wide Band Automatic Gain Control (WB-AGC) including: determining a signal is present when a power derivative of the signal ramps up; adapting a gain for an Automated Gain Control (AGC) when the signal is present; and disabling the adapting when the signal is not present.

15 Claims, 1 Drawing Sheet

WIDE-BAND AUTOMATED GAIN CONTROL FOR BURSTY FRAMES

CROSS-REFERENCE TO RELATED APPLICATIONS AND INCORPORATION BY REFERENCE

The present application claims the benefit under 35 U.S.C. 119(e) of U.S. Provisional Application Ser. No. 63/191,393, filed May 21, 2021, which is incorporated herein by reference in its entirety.

FIELD

Due to fluctuations in power from the received data, there is the need for an Automated Gain Control (AGC) to scale the power of the Wideband digital signal coming into a receiver to avoid saturations or over-scaling. The Wideband AGC (WB-AGC) measures the power of the incoming data, compares it to a reference power value, and applies the appropriate scaling to the inputs in order to achieve the desired power level.

BACKGROUND

The prior art did not have a state machine or power spike detector, as it dealt with continuous transmission.

SUMMARY

This Summary is provided to introduce a selection of concepts in a simplified form that is further described below in the Detailed Description. This Summary is not intended to identify key features or essential features of the claimed subject matter, nor is it intended to be used to limit the scope of the claimed subject matter.

In VLSNR conditions, the power of the desired received signal has a higher probability of being masked by the noise power. This has the potential of driving the power control to undesired levels if the AGC has no means of differentiating between noise power vs signal power. This is exacerbated in bursty frames applications, where the power can fluctuate suddenly at the input of the receiver. If not controlled, this can cause the WB-AGC loop to produce a very large gain when there is no signal present (as the incoming power is low), and cause saturations and signal loss once the signal power returns.

A system of one or more computers can be configured to perform particular operations or actions by virtue of having software, firmware, hardware, or a combination of them installed on the system that in operation causes or cause the system to perform the actions. One or more computer programs can be configured to perform particular operations or actions by virtue of including instructions that, when executed by data processing apparatus, cause the apparatus to perform the actions. One general aspect includes a method to provide adaptive power control for a Wide Band Automatic Gain Control (WB-AGC) including: determining a signal is present when a power derivative of the signal ramps up; adapting a gain for an Automated Gain Control (AGC) when the signal is present; and disabling the adapting when the signal is not present. Other embodiments of this aspect include corresponding computer systems, apparatus, and computer programs recorded on one or more computer storage devices, each configured to perform the actions of the methods.

Implementations may include one or more of the following features. Implementations of the described techniques may include hardware, a method or process, or computer software on a computer-accessible medium.

The method may include measuring a power of the signal.

The method may include detecting a pattern of on, off, on for the signal, wherein the adapting is enabled after the detecting has detected the pattern.

The method where a duration of the pattern is greater than a threshold duration.

The method where a duration of the pattern is increased in a noisy environment.

The method where the determining includes computing the power derivative of the signal, and a positive non-zero value for the power derivative indicates the signal is present.

The method where the determining includes computing the power derivative of the signal, and a non-zero value for the power derivative indicates a power change in the signal.

The method may include filtering the signal to reduce noise prior to the determining.

The method may include subtracting the signal from a previous capture of the signal prior to the determining.

The method where the signal includes multiple carriers.

The method where the signal includes bursts.

The method where after the disabling, the adapting includes setting an AGC start value to a last-known gain used prior to the disabling.

The method where the last known gain is associated with a transmitter of the signal.

The method where the signal has a signal-to-noise ratio ranging from 20 dB to −10 dB.

The method where the signal has a negative dB signal-to-noise ratio.

Additional features will be set forth in the description that follows, and in part will be apparent from the description, or may be learned by practice of what is described.

DRAWINGS

In order to describe the manner in which the above-recited and other advantages and features may be obtained, a more particular description is provided below and will be rendered by reference to specific embodiments thereof which are illustrated in the appended drawings. Understanding that these drawings depict only typical embodiments and are not, therefore, to be limiting of its scope, implementations will be described and explained with additional specificity and detail with the accompanying drawings.

Figure 1:
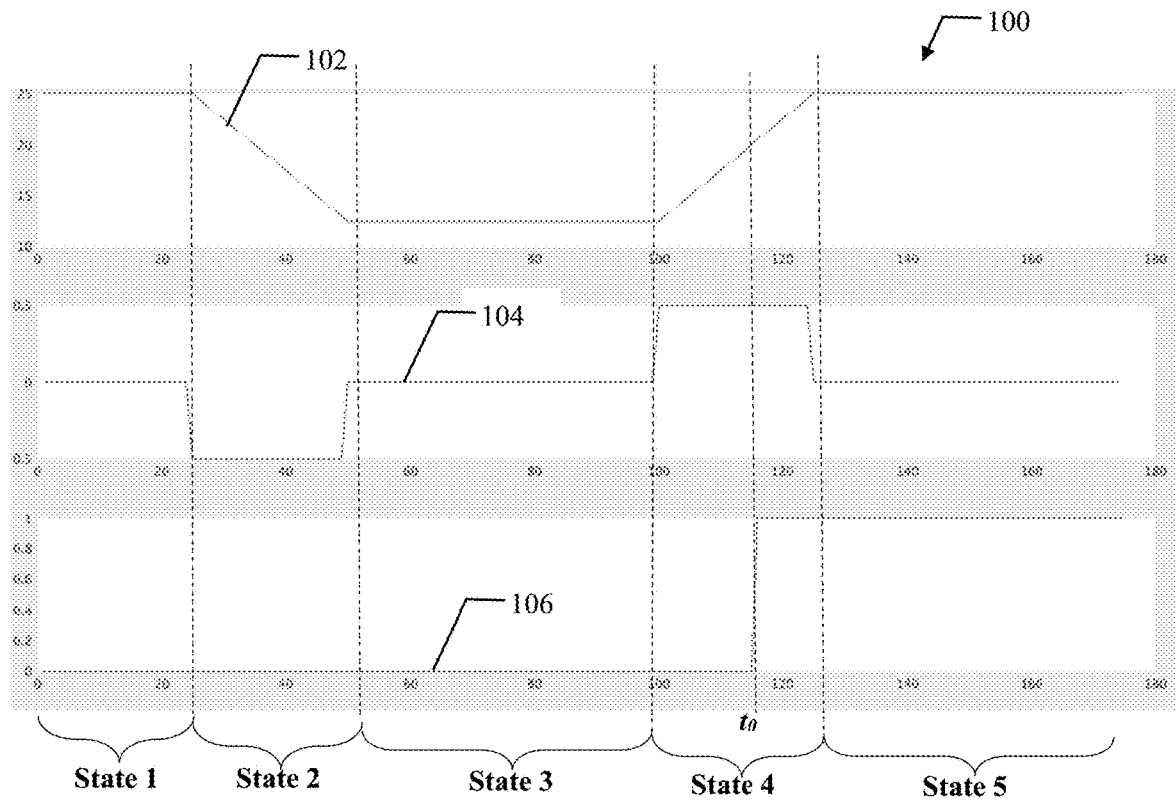
FIG. 1 illustrates a functionality of an adaptive control according to various embodiments.

Throughout the drawings and the detailed description, unless otherwise described, the same drawing reference numerals will be understood to refer to the same elements, features, and structures. The relative size and depiction of these elements may be exaggerated for clarity, illustration, and convenience.

DETAILED DESCRIPTION

The present teachings may be a system, a method, and/or a computer program product at any possible technical detail level of integration. The computer program product may include a computer readable storage medium (or media)

having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punchcards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, or either source code or object code written in any combination of one or more programming languages, including an object oriented programming language such as SMALLTALK, C++ or the like, and conventional procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

Reference in the specification to "one embodiment" or "an embodiment" of the present invention, as well as other variations thereof, means that a feature, structure, characteristic, and so forth described in connection with the embodiment is included in at least one embodiment of the present invention. Thus, the appearances of the phrase "in one embodiment" or "in an embodiment", as well any other variations, appearing in various places throughout the specification are not necessarily all referring to the same embodiment.

The WB-AGC accounts for Very Low SNR (VLSNR) conditions, for example, down to −10 dB SNR. The WB-AGC may be used in applications where an input signal to the receiver is switched on/off, hindering its ability to appropriately adjust the power. One such application uses bursty frames.

In some embodiments, the transmitter of the signal may be a satellite, and the receiver of the signal may be Very Small Aperture Terminal (VSAT). The transmitter may multiplex the signal using time division. The time division multiplexing may be a function of time hopping the signal between beams, enabling or displaying coverage of a beam coverage area, moving between different beam coverage areas, moving between a satellite coverage area and a satellite non-coverage area, or the like. The time division multiplexing of the signal may be of a fixed or variable duration.

After determining a signal is present, the WB-AGC may set a gain of the AGC to a last-known gain value when adapting a gain for the AGC. In some embodiments, the last-known value may be associated with a specific transmitter. For example, when a transmitter of the signal changes in a known pattern a respective last-known value of the gain may be associated and used when adapting the AGC of the signal from the respective transmitter. Exemplary transmitters changing in a known pattern include constellations of Low-Earth Orbit (LEO) and Mid-Earth Orbit (MEO) satellites.

The present teachings can handle carriers with alternate coding and modulation (ACM), for example, BPSK, 8PSK, 16APSK, 32APSK, 64APSK, and 256APSK constellations. These carriers may be packaged according to a standard, for example, DVBS2/2X standard. The carriers may appear as either continuous or bursty frames to the receiver. The bursts may be encapsulated in a "superframe" format. The superframe may be of a fixed sized length. In some embodiments, variable sized superframes are supported.

The WB-AGC may track the power of the incoming bursts, with or without superframes, fixed or variable superframe sizes, with a signal-to-noise ratio ranging from 20 dB to −10 dB. The WB-AGC may handle multiple carriers of this format, in a frequency band, for example, a frequency band of up to 2 Gsps.

The new WB-AGC may include a power detector, lock detector and state machine. The WB-AGC halts the adaptation of the loop when sudden power changes occur. It determines the presence of signal ON (signal+noise power), or OFF (only noise power) and reacts to its presence. The WB-AGC is geared towards the acquisition process, when the receiver is turned on and information packets/bursts/frames have not yet been acquired or locked-on. In this initial scenario the receiver cannot estimate a system-based time of when to turn off the gain adaptation. The WB-AGC state machine may take control of the loop adaptation during the acquisition time and cede control once "demod-lock" has occurred.

The WB-AGC detects power drops/surges by computing a derivative of the incoming signal power. The input signal power is measured or computed, filtered to reduce noise, and subtracted against the previous captures. This produces a power derivative. Its absolute value indicates a sudden power change, and its sign indicates whether the signal is OFF (not present) or ON (present). A state machine can decide whether to start or stop the gain loop adaptation based on the power derivative.

FIG. 1 illustrates a functionality of an adaptive control according to various embodiments.

FIG. 1 illustrates a functional visualization of an adaptive control 100 of a WB-AGC. In some embodiments, the adaptive control 100 in a WB-AGC includes one or more states. The visualization includes a power measurement 102 (present, falling, not present, rising), a power derivative line 104 (d(Power)/dx as constant, negative, positive), and an adaption line 106 (toggle allowing adaptation of gain by WB-AGC).

In state 1, a signal is present per a portion of power measurement 102 within state 1 that indicates signal presence. The power is constant and a portion of power derivative 104 within state 1 is zero. As such, the adaptive control 100 sets adaptation to off per adaption line 106 within state 1. With the adaptation being off, a gain applied to the signal does not change.

In state 2, a signal is not present and is ramping down per a portion of power measurement 102 within state 2. A duration of the signal ramp down may be based on a loop bandwidth. As such, a portion of power derivative 104 within state 2 spikes down. The adaptive control 100 disables or sets adaptation to off per a portion of adaption line 106 within state 2. With the adaptation being off, a gain to be applied to the signal does not change.

In state 3, a signal is not present per a portion of power measurement 102 within state 3. The power is constant and a portion of power derivative 104 within state 3 is zero. As such, adaptation is turned off per a portion of adaptation line 106 within state 3. With the adaptation being off, a gain applied to the signal does not change.

In state 4, a signal is present and ramping up per a portion of power measurement 102 within state 4. As such, a portion of power derivative 104 within state 4 spikes up. When a state machine has determined a pattern of ON, OFF, ON, for example, at time to in state 4, adaptation is turned on per a portion of adaption line 106 within state 4. As such, a gain of the WB-ABC is allowed to adapt. In case of misdetection, (for example, a power drop is detected instead of a power surge) the adaptive control 100 may return to state 1 and may resume on trying to detect a pattern.

In state 5, a signal is present per a portion of power measurement 102 within state 4. Further to adaptation being turned on in state 4, the adaptation is kept turned on (gain adapts) while a signal is present is indicated. When a signal absence is determined per the power measurement 102, the adaptive control 100 returns to state 2.

Programmable detection/misdetection counters and thresholds may be used to manage an operation of the state machine 100. The counter values indicate the amount of "time" (measured in clock instances) that the "event", defined as the power derivative value being above or below a threshold, should occur to declare a "success" when a declaring power surge (signal ON) or power drop (signal OFF).

In some embodiments, a power surge/drop detection can be made more robust for noisy environments. In some embodiments, a power surge/drop detection can be made less robust for low-noise environments. For low-noise environments, there is a high probability that a power surge/drop declaration is not a miss-detection. In this case the detection counters can be set to lower values, decreasing the latency of detection. This is in contrast to high-noise environments where these counters should be set to higher values as having only 1 event is not a probabilistic measure of success.

During operation, noise may be at 0 dBFS at a maximum gain of the WB-AGC. In some embodiments, the WB-AGC may have a range of up to 72 dB.

Figure 2:
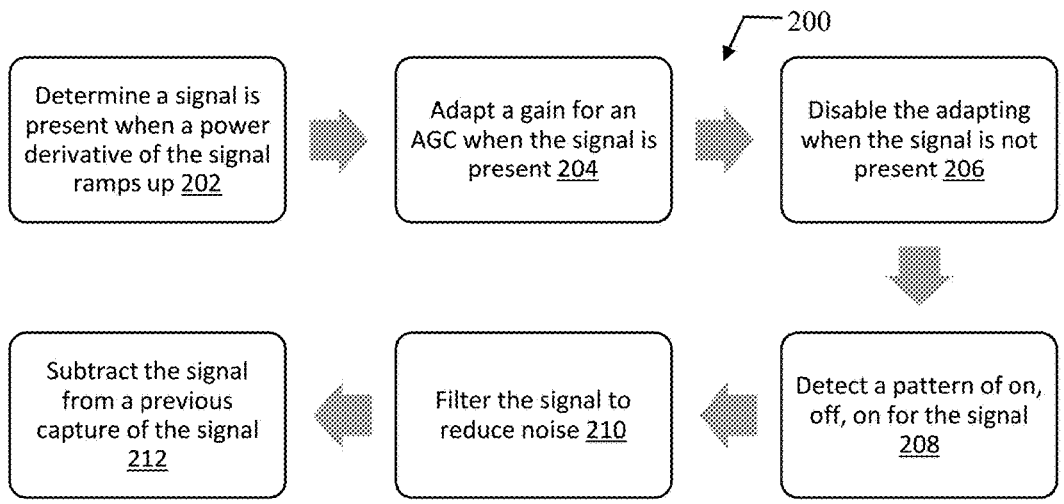
FIG. 2 illustrates a process to provide adaptive power control for a Wide Band Automatic Gain Control (WB-AGC) according to various embodiments.

FIG. 2 illustrates a process to provide adaptive power control for a Wide Band Automatic Gain Control (WB-AGC) according to various embodiments.

A process 200 may include operation 202 to determine a signal is present when a power derivative of the signal ramps up. The process 200 may include operation 204 to adapt a gain for an AGC when the signal is present. The process 200 may include operation 204 to disable the adapting when the signal is not present. The process 200 may include operation 208 to detect a pattern of on, off, on for the signal. The process 200 may include operation 210 to filter the signal to reduce noise. The process 200 may include operation 212 to subtract the signal from a previous capture of the signal.

Having described preferred embodiments of a system and method (which are intended to be illustrative and not limiting), it is noted that modifications and variations can be made by persons skilled in the art considering the above teachings. It is therefore to be understood that changes may be made in the embodiments disclosed which are within the scope of the invention as outlined by the appended claims. Having thus described aspects of the invention, with the details and particularity required by the patent laws, what is claimed and desired protected by Letters Patent is set forth in the appended claims.

I claim:

1. A method to provide adaptive power control for a Wide Band Automatic Gain Control (WB-AGC), the method comprising:
   determining a signal is present when a power derivative of the signal ramps up;
   adapting a gain for an Automated Gain Control (AGC) when the signal is present; and
   disabling the adapting when the signal is not present.

2. The method of claim 1, further comprising measuring a power of the signal.

3. The method of claim 1, further comprising detecting a pattern of on, off, on for the signal, wherein the adapting is enabled after the detecting has detected the pattern.

4. The method of claim 3, wherein a duration of the pattern is greater than a threshold duration.

5. The method of claim 3, wherein a duration of the pattern is increased in a noisy environment.

6. The method of claim 1, wherein the determining comprises computing the power derivative of the signal, and a positive non-zero value for the power derivative indicates the signal is present.

7. The method of claim 1, wherein the determining comprises computing the power derivative of the signal, and a non-zero value for the power derivative indicates a power change in the signal.

8. The method of claim 1, further comprising filtering the signal to reduce noise prior to the determining.

9. The method of claim 1, further comprising subtracting the signal from a previous capture of the signal prior to the determining.

10. The method of claim 1, wherein the signal comprises multiple carriers.

11. The method of claim 1, wherein the signal comprises bursts.

12. The method of claim 1, wherein after the disabling, the adapting comprises setting an AGC start value to a last-known gain used prior to the disabling.

13. The method of claim 12, wherein the last known gain is associated with a transmitter of the signal.

14. The method of claim 1, wherein the signal has a signal-to-noise ratio ranging from 20 dB to −10 dB.

15. The method of claim 1, wherein the signal has a negative dB signal-to-noise ratio.

* * * * *